(12) United States Patent
Kojo (10) Patent No.: US 9,219,217 B2
(45) Date of Patent: Dec. 22, 2015

(54) SURFACE MOUNT TYPE PIEZOELECTRIC OSCILLATOR

(71) Applicant: Daishinku Corporation, Hyogo (JP)

(72) Inventor: Takuya Kojo, Hyogo (JP)

(73) Assignee: Daishinku Corporation, Hyogo (JP)

( * ) Notice: Subject to any disclaimer, the term of this patent is extended or adjusted under 35 U.S.C. 154(b) by 0 days.

(21) Appl. No.: 14/381,117

(22) PCT Filed: Jan. 8, 2013

(86) PCT No.: PCT/JP2013/000008
§ 371 (c)(1),
(2) Date: Aug. 26, 2014

(87) PCT Pub. No.: WO2013/128782
PCT Pub. Date: Sep. 6, 2013

(65) Prior Publication Data
US 2015/0015341 A1     Jan. 15, 2015

(30) Foreign Application Priority Data

Feb. 28, 2012 (JP) ................................ 2012-042175

(51) Int. Cl.
*H03B 5/32* (2006.01)
*H01L 41/047* (2006.01)
(Continued)

(52) U.S. Cl.
CPC .......... *H01L 41/047* (2013.01); *H01L 41/0475* (2013.01); *H01L 41/053* (2013.01); *H01L 41/0913* (2013.01); *H03B 5/32* (2013.01);
(Continued)

(58) Field of Classification Search
CPC .............. H01L 41/047; H01L 41/0475; H01L 41/0477; H01L 41/053; H01L 41/0913; H01L 41/1136; H03B 5/30; H03B 5/32; H03H 9/05; H03H 9/0514; H03H 9/0519; H03H 9/0523; H03H 9/10; H03H 9/1021; H03H 9/125; H03H 9/13; H03H 9/132; H03H 9/17; H03H 9/19
USPC .......... 310/344, 348, 365, 366, 368; 331/154, 331/156, 158
See application file for complete search history.

(56) References Cited

U.S. PATENT DOCUMENTS 6,229,249 B1 * 5/2001 Hatanaka et al. ............. 310/348
7,821,347 B2 * 10/2010 Harima ........................ 331/158
(Continued)

FOREIGN PATENT DOCUMENTS

| JP | 2001-274628 | 10/2001 |
|----|-------------|---------|
| JP | 2001-291742 | 10/2001 |

(Continued)

*Primary Examiner* — Levi Gannon
(74) *Attorney, Agent, or Firm* — Jordan and Hamburg LLP (57) ABSTRACT

A piezoelectric oscillator has an insulating base having a housing portion where internal terminal pads are formed, an integrated circuit (IC) element having rectangular pads bonded to the internal terminal (IT) pads, and a piezoelectric oscillation element (POE) connected to the base and IC element. The IT pads include two opposing first IT pads connected to the POE, two opposing second IT pads, one of which is for AC output, and two opposing third IT pads formed between the first IT pads and the second IT pads. Along a part of perimeter of the first IT pads, the third IT pads and wiring patterns which respectively extend the third IT pads are formed as conductive paths for blocking radiation noise. The first IT pads and the second IT pads are spaced apart with the conductive paths interposed therebetween.

8 Claims, 4 Drawing Sheets

(51) Int. Cl.
*H01L 41/053* (2006.01)
*H03H 9/05* (2006.01)
*H03H 9/10* (2006.01)
*H03H 9/19* (2006.01)
*H01L 41/09* (2006.01)
*H03H 9/02* (2006.01)

(52) U.S. Cl.
CPC ......... *H03H9/02086* (2013.01); *H03H 9/0519* (2013.01); *H03H 9/0523* (2013.01); *H03H 9/0547* (2013.01); *H03H 9/0552* (2013.01); *H03H 9/10* (2013.01); *H03H 9/1021* (2013.01); *H03H 9/19* (2013.01); *H03B 2200/002* (2013.01); *H03B 2200/0026* (2013.01)

(56) References Cited

U.S. PATENT DOCUMENTS

| | | | | |
|---|---|---|---|---|
| 8,941,444 | B2* | 1/2015 | Asamura | 331/158 |
| 2007/0075796 | A1* | 4/2007 | Mizumura et al. | 331/158 |
| 2007/0120614 | A1* | 5/2007 | Moriya et al. | 331/158 |
| 2008/0290956 | A1* | 11/2008 | Horie | 331/68 |
| 2011/0221303 | A1* | 9/2011 | Chiba | 310/313 R |
| 2012/0139653 | A1* | 6/2012 | Owaki et al. | 331/163 |
| 2012/0262030 | A1* | 10/2012 | Kojo et al. | 310/348 |
| 2012/0280759 | A1* | 11/2012 | Kojo et al. | 331/155 |
| 2013/0135055 | A1* | 5/2013 | Harima | 331/116 R |

FOREIGN PATENT DOCUMENTS

| | | |
|---|---|---|
| JP | 2005-295115 | 10/2005 |
| JP | 2006-191517 | 7/2006 |
| JP | 2007-274339 | 10/2007 |
| JP | 2009-124619 | 6/2009 |
| JP | 2009-141666 | 6/2009 |
| JP | 2009-177543 | 8/2009 |
| JP | 2009-246696 | 10/2009 |
| JP | 2010-050537 | 3/2010 |
| JP | 2010-050591 | 3/2010 |
| JP | 2010-087714 | 4/2010 |
| JP | 2010-119013 | 5/2010 |

* cited by examiner

SURFACE MOUNT TYPE PIEZOELECTRIC OSCILLATOR

TECHNICAL FIELD

The invention relates to surface mount type piezoelectric oscillators structurally characterized in that a package is constructed of a base having an opening on its upper-surface side and a housing portion formed in its interior, and a cover that seals the opening, and a piezoelectric oscillation element and an integrated circuit element are housed in the housing portion of the base (hereinafter, simply referred to as "piezoelectric oscillator"). The invention more particularly relates to improvements in such package constructions of the piezoelectric oscillators.

BACKGROUND ART

Very accurate oscillatory frequencies can be constantly obtained with the piezoelectric oscillators in which piezoelectric oscillation elements, for example, crystal oscillation plates, are used. Such piezoelectric oscillators are, therefore, conventionally employed in diverse fields as reference frequency sources for electronic devices. The piezoelectric oscillators typically have a structure where an integrated circuit element is housed in a housing portion of an insulating base with an opening on its upper-surface side, a piezoelectric oscillation element is securely supported in the upper direction of the integrated circuit element, and a cover is provided to hermetically seal the interior of the base.

One can simplify the structure of such a piezoelectric oscillator with a relatively small number of components by customizing a one-chip integrated circuit element in which an inverter amplifier, for example, CMOS, is provided as an oscillation amplifier, contributing to cost reduction.

In recent years, flip-chip bonding is often employed in such piezoelectric oscillators because this bonding technique, in contrast to wire bonding, reduces the piezoelectric oscillators in size and height. As disclosed in the patent document 1, pads of an integrated circuit element are flip-chip bonded, by means of metallic bumps made of such a material as gold, to internal terminal pads in a housing portion of a ceramic base by supersonic thermocompression bonding.

Figure 7:
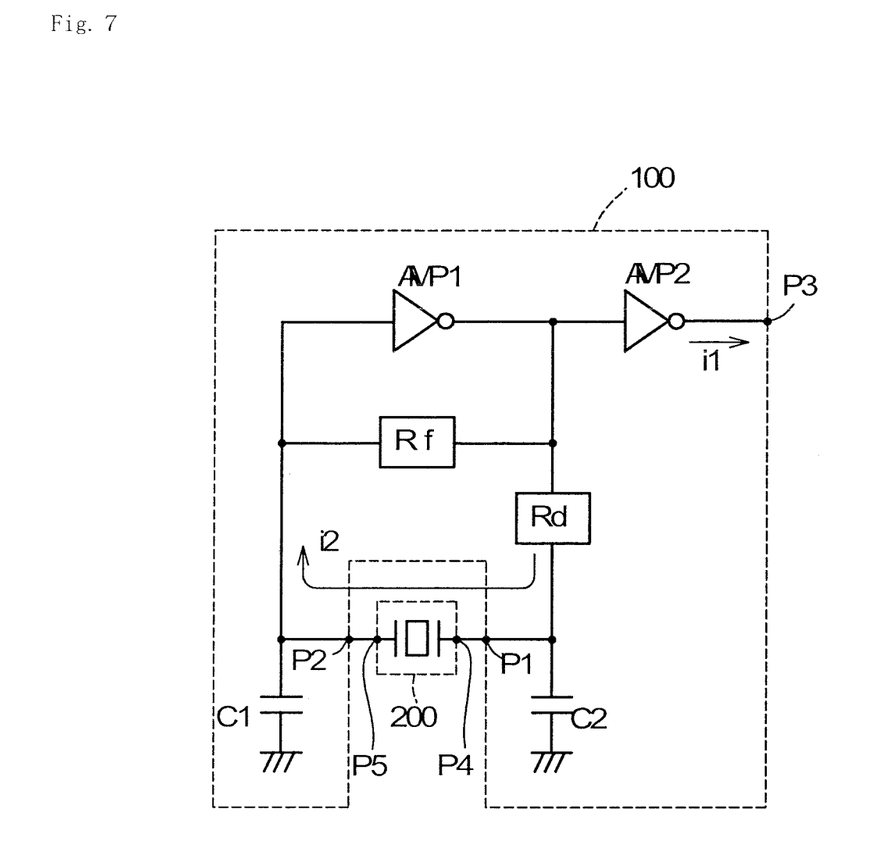
FIG. 7 is a circuit diagram of a piezoelectric oscillator.

FIG. 7 illustrates an example of piezoelectric oscillator circuits to be housed in the base. In the drawing, 100 is an integrated circuit element, and 200 is a piezoelectric oscillation element. The integrated circuit element 100 includes, for example, inverter amplifiers AMP1 and AMP2, a feedback resistor Rf, a limiting resistor Rd, and capacitors C1 and C2. Referring to the other reference symbols, P1 to P3 are signal input and output portions of the integrated circuit element 100, and P4 and P5 are signal input and output portions of the piezoelectric oscillation element 200. An alternating current signal or a high frequency signal i1 is outputted from the output portion P3 of the integrated circuit element 100. An alternating current signal i2 flows between the input and output portions P5 and P4 of the piezoelectric oscillation element 200 and the input and output portions P1 and P2 of the integrated circuit element 100. The integrated circuit element and the piezoelectric oscillation element are thus connected in the circuit and housed in the base. In the base, the input and output portions P1 to P5 for the signals i1 and i2 are connected by means of the pads of the integrated circuit element, internal terminal pads of the base, pads of the piezoelectric oscillation element, and wiring patterns.

RELATED ART DOCUMENT

Patent Document

Patent Document 1: JP 2001-291742 A

SUMMARY OF THE INVENTION

Problem to be Solved by the Invention

In the case where such a piezoelectric oscillator is miniaturized, its operation is easily adversely affected by unwanted radiation (hereinafter, called radiation noise). The radiation noise is generated by alternating current signals and/or high frequency signals flowing from the internal terminal pad for output of the base connected to the output pad of the integrated circuit element (which corresponds to the signal output portion P3 illustrated in FIG. 7) to the wiring pattern for output (output portion of the integrated circuit element).

The piezoelectric oscillator undergoes the occurrence of phase differences and potential differences due to different waveforms between signals flowing through the signal output portions of the integrated circuit element and signals flowing through the internal terminals pad for input which connect the signal input and output portions of the piezoelectric oscillation element and also flowing through the wiring patterns which connect these pads (connecting portion of the piezoelectric oscillation element) although these signals have the same frequency. These phase and current differences may cause interactions between the signals outputted from the integrated circuit element and the signals flowing through the connecting portions of the piezoelectric oscillation element, possibly resulting in operational problems. Conventionally, signals at the connecting portions of the piezoelectric oscillation element are sine wave signals, whereas signals at the output portions of the integrated circuit element are rectangular wave signals. Therefore, output signals include high frequency components that cause radiation noise as well as principal vibrations. As the frequency of the piezoelectric oscillator becomes higher, the high frequency noise components are more easily radiated as electromagnetic waves. The electromagnetic wave thus radiated may adversely affect the oscillation frequency of the piezoelectric oscillation element which is an oscillation source.

The invention has an object to provide a piezoelectric oscillator hardly adversely affected by radiation noise even when miniaturized and achieving remarkable electric characteristics and high operational reliability.

SUMMARY OF THE INVENTION

To accomplish the object, the invention provides a piezoelectric oscillator including: an insulating base including a laminated substrate and provided with a housing portion and a plurality of internal terminal pads formed on an inner bottom surface of the housing portion; an integrated circuit element having a rectangular shape and pads formed on a main surface thereof and bonded to a part of the internal terminal pads of the base by means of bumps; and a piezoelectric oscillation element electromechanically bonded to another part of the internal terminal pads of the base and electrically connected to the integrated circuit element.

The pads of the integrated circuit element at least include two opposing first pads formed near a first side of the integrated circuit element, two opposing second pads formed near a second side opposite to the first side of the integrated circuit element, and two opposing third pads formed between the first pads and the second pads.

One of the two second pads is used to output alternating current signals of the integrated circuit element. The internal terminal pads of the base at least include two opposing first internal terminal pads electrically connected to the piezoelectric oscillation element and bonded to the two first pads of the integrated circuit element, two opposing second internal terminal pads bonded to the two second pads of the integrated circuit element, and two opposing third internal terminal pads bonded to the two third pads of the integrated circuit element.

The third internal terminal pads and wiring patterns which extend the third internal terminal pads are formed along a part of perimeter of the first internal terminal pads as conductive paths for blocking radiation noise. The two first internal terminal pads and the two second internal terminal pads are respectively formed at positions spaced apart with the conductive paths interposed therebetween. The wiring patterns which extend the third internal terminal pads are formed on an inner bottom surface of the housing portion along with the first to third internal terminal pads.

The integrated circuit element may have more pads than the first to third pads. Correspondingly, there may be more internal terminal pads than the first to third internal terminal pads. The first to third pads of the integrated circuit element may be unidirectionally juxtaposed. The arrangement of the pads of the integrated circuit element, however, is not necessarily limited to juxtaposition in one direction as far as the arrangement of these pads coincides with the arrangement of the pads of the integrated circuit element.

By forming the third internal terminal pads and the wiring patterns which extend the third internal terminal pads are formed along a part of perimeter of the first internal terminal pads as conductive paths for blocking radiation noise, the first internal terminal pads electrically connected to the piezoelectric oscillation element can be spaced from the second internal terminal pads in one of which AC output is included with the conductive paths interposed therebetween.

This structural advantage enables the conductive paths to block any radiation noise generated by the alternating current signals and/or high frequency signals flowing through one of the second internal terminal pads. The radiation noise thus blocked does not arrive at the first internal terminal pads connected to the piezoelectric oscillation element which is easily adversely affected by the noise.

This successfully prevents the radiation noise generated by the alternating current outputs of the second internal terminal pads from adversely affecting the piezoelectric oscillation element electrically connected to the first internal terminal pads.

Conventionally, the piezoelectric oscillators undergo the occurrence of phase differences and potential differences between signals flowing through the alternating current output in one of the second internal terminal pads and signals flowing through the first internal terminal pads connected to the piezoelectric oscillation element although these signals have the same frequency. These phase and current differences cause interactions between the alternating current output of the second internal terminal pad and the first internal terminal pads, possibly resulting in operational problems.

On the other hand, the invention controls any operational problems caused by such interactions because the first internal terminal pads electrically connected to the piezoelectric oscillation element are shut off from the second internal terminal pads in one of which the AC output is included by the conductive paths interposed therebetween.

Preferably, the first internal terminal pads and the second internal terminal pads are formed in larger widths than the third internal terminal pads located between the first and second internal terminal pads in a direction where the two first internal terminal pads, two second internal terminal pads, and two third internal terminal pads are juxtaposed.

The operational advantage of this structure in addition to the advantage described earlier is, when the internal terminal pads of the base and the pads of the integrated circuit element are flip-chip bonded by means of bumps, the first and second internal terminal pads formed in large widths absorb any positional displacement of the bumps relative to the pads or any positional displacement between the pads of the integrated circuit element and the internal terminal pads of the base. This prevents such an unfavorable event that the bumps stick out of the internal terminal pads at the time of bonding.

Because the first and second internal terminal pads are thus formed in larger widths than the third internal terminal pads which form a part of the conductive paths, integrated circuit elements of various types with slightly different plane areas and/or with pads somewhat differently located can be similarly mounted on the same base.

This provides a diversified range of products and facilitates cost reduction. The piezoelectric oscillator thus structurally characterized can be miniaturized by reducing distances between the first and second internal terminal pads without undermining the radiation noise blocking effect by the third internal terminal pads formed in small widths in the direction where the internal terminal pads are juxtaposed.

The invention, while succeeding in miniaturizing the piezoelectric oscillator, can improve mountability in flip-chip bonding of the integrated circuit element, bonding reliability, and versatility.

Effects of the Invention

As described so far, the invention provides a piezoelectric oscillator hardly adversely affected by radiation noise even when miniaturized and having remarkable electric characteristics and high operational reliability.

MODES FOR CARRYING OUT THE INVENTION

Figure 1:
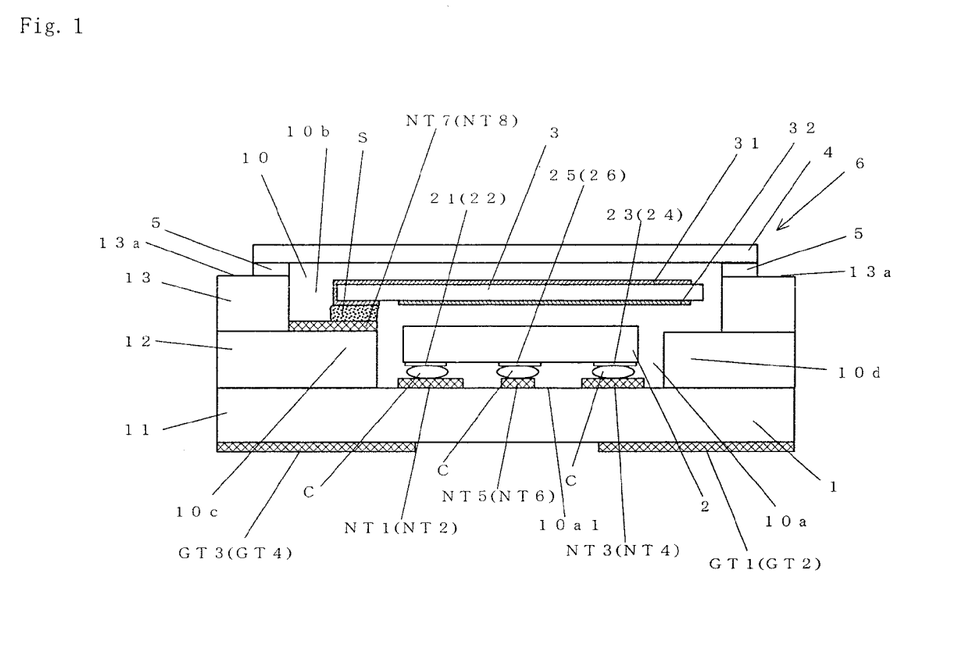
FIG. 1 is a sectional view of a first example of the invention.
Figure 2:
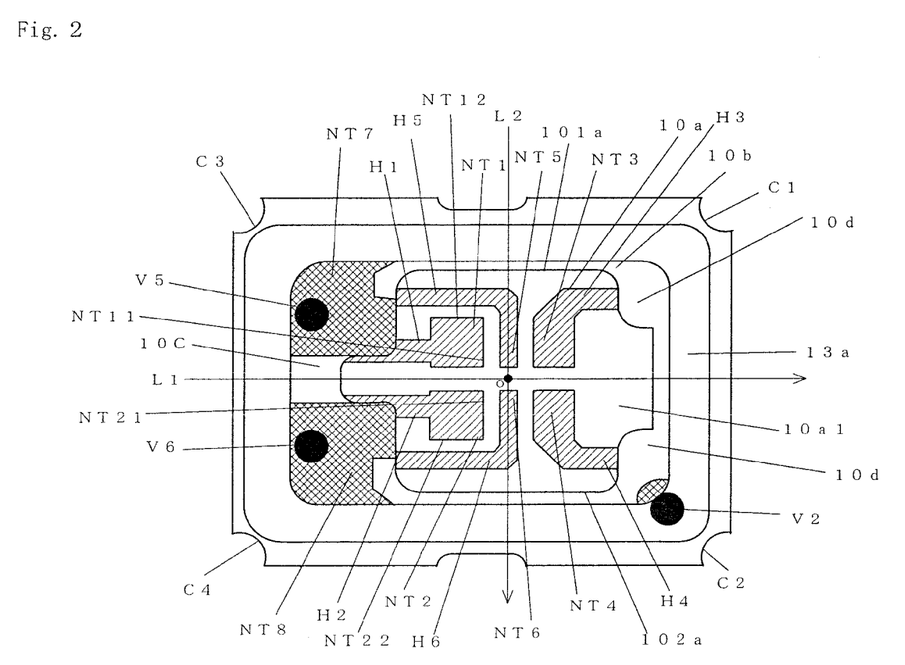
FIG. 2 is a plan view of a base before an integrated circuit element and a piezoelectric oscillation element illustrated in FIG. 1 are mounted thereon in the first example.
Figure 3:
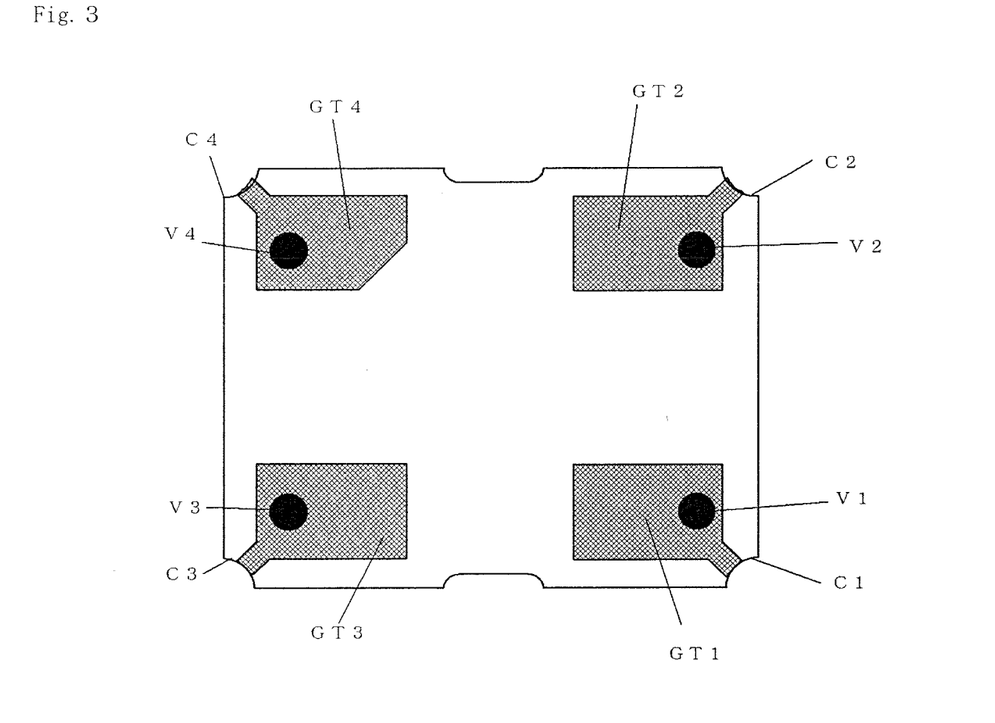
FIG. 3 is a bottom view of the base illustrated in FIG. 1 in the first example.
Figure 4:
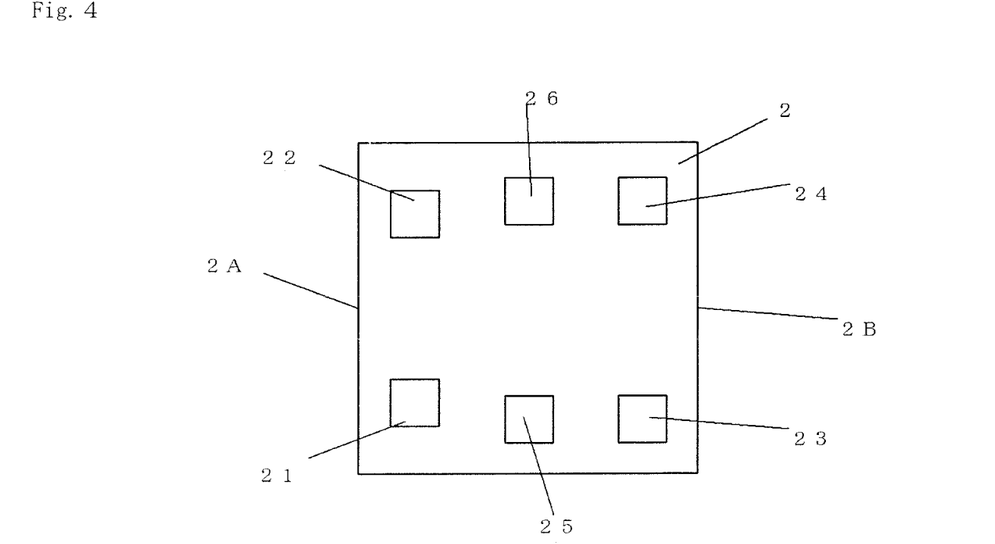
FIG. 4 is a bottom view of an integrated circuit element to which the invention is applied.
Figure 5:
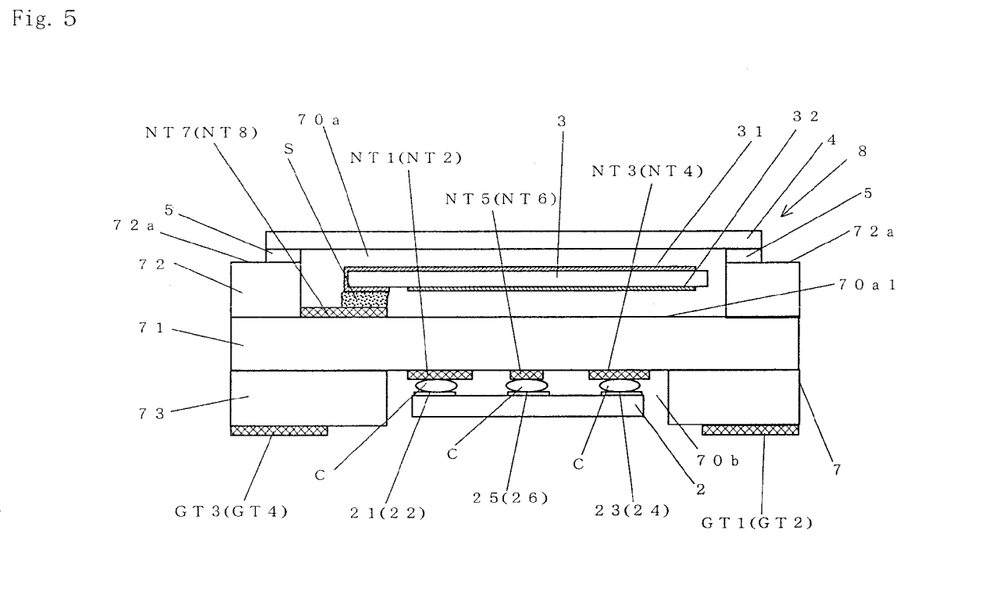
FIG. 5 is a sectional view of a second example of the invention.
Figure 6:
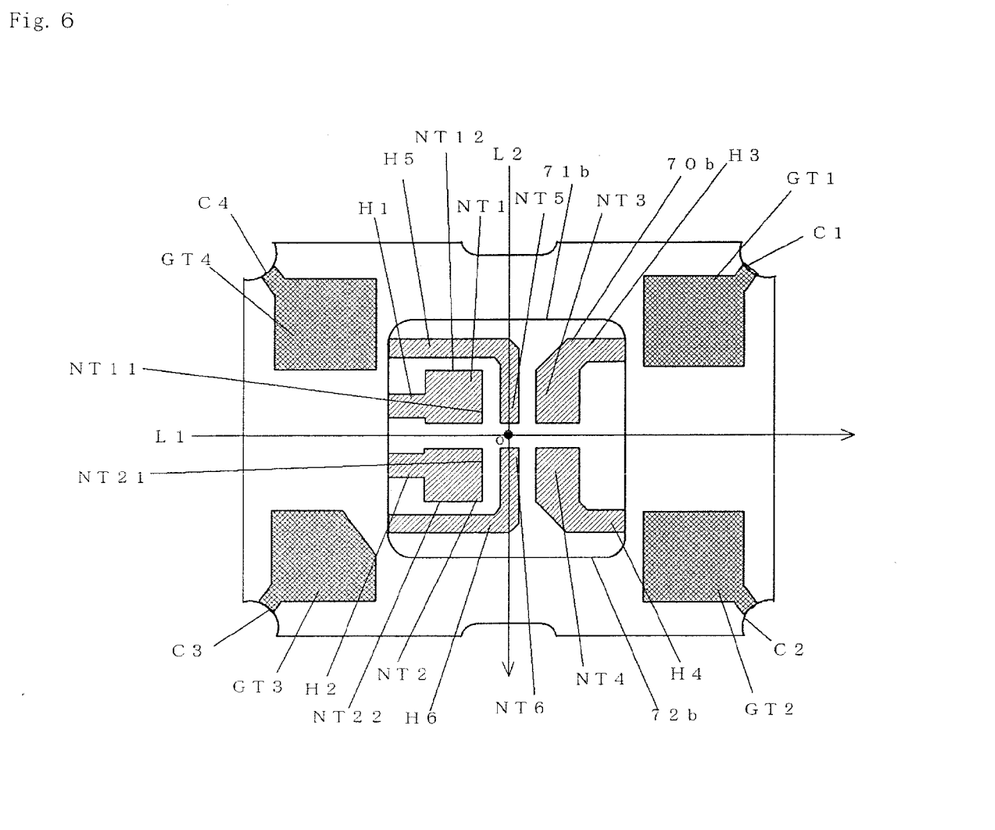
FIG. 6 is a bottom view of a base before an integrated circuit element illustrated in FIG. 5 is mounted thereon in the second example.

Hereinafter, examples of a piezoelectric oscillator according to the invention are described in detail referring to the accompanying drawings. FIGS. 1 to 3 illustrate a first example of the invention. FIG. 4 is a bottom view of an integrated circuit element to which the invention is applied. FIGS. 5 and 6 illustrate a second example of the invention. In the examples of the invention, any similar components or components consistently used in the examples are illustrated with the same reference symbols. The piezoelectric oscillator used in these examples is a crystal oscillator.

A crystal oscillator 6 has a base 1 formed from an insulating ceramic laminated substrate with a recessed portion, an integrated circuit element 2 housed in the base 1, a piezoelectric oscillation element 3 housed in an upper part of the base 1, and a cover 4 bonded to an opening of the base 1. The package of the crystal oscillator 6 is constructed of the base 1 and the cover 4.

The base 1 and the cover 4 are heated to melt a sealing material 5 applied to therebetween and bonded to each other. The piezoelectric oscillation element 3 includes an AT-cut crystal oscillation plate. The interior of the base 1 bonded to the cover 4 with the sealing material 5 is hermetically sealed. The examples of the invention are hereinafter described.

First, the first example 1 is described referring to FIGS. 1 to 4. The base 1 of the crystal oscillator 6 has an opening on its upper-surface side alone. The integrated circuit element 2 is mounted on an inner bottom surface of the base 1 and housed in the base 1. The piezoelectric oscillation element 3 is located in an upper part of the base 7 and housed in the base 1. The crystal oscillator 6 has a laminated structure where the integrated circuit element 2 and the piezoelectric oscillation element 3 are vertically provided.

The base 1 includes a ceramic laminated substrate, and its overall shape is rectangular parallelepiped. The base 1 has a bottom portion 1 which is a lowermost layer, a bank portion 12 which is a middle layer, and a bank portion 13 which is an uppermost layer. The bottom portion 11 is formed from a single plate having a rectangular shape in planar view and made of an insulating ceramic material such as alumina.

The bank portion 12 is formed on the bottom portion 11. The bank portion 12 is formed of a ceramic material in a rectangular shape in planar view. The bank portion 13 is formed of a ceramic material in a rectangular shape in planar view. The base 1 constructed of these portions is a box-shaped member where a housing portion 10 is formed therein in a recessed shape in cross section. The bank portions 12 and 13 are formed along perimeter of the housing portion 10.

The bank portion 13 has a flattened upper surface. The bank portions 12 and 13 constitute the side wall of the base 1. The upper surface of the bank portion 13 is an upper end surface of the base 1. The housing portion 10 has a rectangular shape in planar view. The housing portion 10 includes a first housing portion 10a located in a lower part thereof, and a second housing portion 10b located in an upper part thereof. The integrated circuit element 2 is housed in the first housing portion 10a, and the piezoelectric oscillation element 3 is housed in the second housing portion 10b.

The base 1 according to the first example has a three-layer structure in which the bottom portion 11 and the bank portions 12 and 13 are stacked on one another. The base 1, however, may have a monolayer structure, a two-layer structure, or a four-layer structure depending on the shape of the housing portion 10 formed in the base 1.

The upper surface of the bank portion 13 of the base 1 is a joint area 13a to be bonded to the cover 4. The joint area 13a includes a metallic film. More specifically, the joint area 13a includes three metallic layers; a metalized layer in which a metalizing material such as tungsten or molybdenum is used, a nickel layer formed on the metalized layer, and a gold layer formed on the nickel layer. These layers are integrally formed by metalizing during firing of the ceramic material, in which thick film printing is leveraged. Then, the nickel layer and the gold layer are formed on the metalized layer by plating in the mentioned order.

At four corners of the outer peripheral wall of the base 1 are formed a plurality of castellations C1, C2, C3, and C4 vertically extending. These castellations are obtained by vertically forming circular cutouts in the outer peripheral wall of the base.

The joint area 13a is electrically led out to an external terminal pad GT2 formed on an outer bottom surface of the base through at least one of a conductive via V2 vertically through-connecting the bank portions 12 and 13 of the base and a wiring pattern, not illustrated in the drawings, formed in an upper part of the castellation C2.

When the external terminal pad GT2 is ground-connected, the metallic cover 4 is grounded through the joint area 13a, conductive via, and wiring pattern in the upper part of the castellation. As a result of the grounding, the crystal oscillator 6 exerts an electromagnetic shielding effect.

In the base 1, the bank portion 12 forms the first housing portion 10a substantially rectangular in planar view in which the integrated circuit element 2 is housed. Referring to the drawings, inner side surfaces on right and left of the bank portion 12 are protruding more inward than the bank portion 13. The left protruding part of the bank portion 12 serves as a holding table 10c for holding one end part of the piezoelectric oscillation element 3. The right protruding part of the bank portion 12 serves as a pillow portion 10d located opposite to the holding table 10c with the first housing portion 10a interposed therebetween.

In the upper direction of the first housing portion 10a is provided the second housing portion 10b formed by the bank portion 13. Referring to the plan view of the drawings, pairs of pads arranged vertically on the drawing are respectively juxtaposed laterally on an inner bottom surface 10a1 of the first housing portion 10a. The paired internal terminal pads are respectively first internal terminal pads NT1 and NT2, second internal terminal pads NT3 and NT4, and third internal terminal pads NT5 and NT6. The first housing portion 10a has a substantially rectangular shape in planar view with two specific sides 101a and 102a extending in parallel with the direction where these pads are juxtaposed.

On the upper surface of the lowermost bottom portion 11 of the base 11 that is the inner bottom surface 10a1 of the first housing portion 10a, there are a plurality of rectangular internal terminal pads NT (NT1 to NT6) connected to the pads of the integrated circuit element 2, and wiring patterns H (H1 to H6 described later) which extend these pads. These pads and wiring patterns are respectively formed adjacent to one another.

As illustrated in FIG. 2, of the internal terminal pads NT, the paired two first internal terminal pads NT1 and NT2, respectively for AC input and output, are electrically connected to signal input and output pads, not illustrated in the drawing, of the piezoelectric oscillation element 3, and the internal terminal pads NT1 and NT2 are also connected to the paired two first pads 21 and 22 of the integrated circuit element 2.

One of the first pads 21 and 22 of the integrated circuit element 2 is connected to the signal input pad of the piezoelectric oscillation element 3 through one of the first internal terminal pads NT1 and NT2. The other one of the first pads 21 and 22 is connected to the signal output pad of the piezoelectric oscillation element 3 through the other one of the first internal terminal pads NT1 and NT2. The paired two second internal terminal pads NT3 and NT4, respectively for AC output of the integrated circuit element 2 and for grounding of the integrated circuit element 2, are connected to the paired two second pads 23 and 24 of the integrated circuit element 2.

According to this example, the second pad 23 of the integrated circuit element 2 is a pad through which alternating current signals are outputted from the integrated circuit element 2. The alternating current signals are then outputted to the second internal terminal pad NT3. The paired two third internal terminal pads NT5 and NT6 are pads to which a direct current potential or ground potential is applied. These pads NT5 and NT6 are connected to the paired two third pads 25 and 26 of the integrated circuit element 2. The direct current potential or ground potential applied to the pads NT5 and NT6 is supplied from the integrated circuit element 2. The wiring pattern H includes six wiring patterns; first to six wiring patterns H1 to H6. The first wiring patterns H1 and H2 respectively extend the first internal terminal pads NT1 and NT2. The second wiring patterns H3 and H4 respectively extend the second internal terminal pads NT3 and NT4. The third wiring patterns H5 and H6 respectively extend the third internal terminal pads NT5 and NT6.

As illustrated in FIG. 2, the third internal terminal pad NT5 and the third wiring pattern H5 are formed along two sides (along apart of two sides) of the first internal terminal pad NT1. Further, the third internal terminal pad NT6 and the third wiring pattern H6 are formed along two sides (along a part of two sides) of the first internal terminal pad NT2.

The third internal terminal pad NT5 and the third wiring pattern H5, and the third internal terminal pad NT6 and the third wiring pattern H6 respectively form radiation noise blocking conductive paths. These conductive paths serve to block radiation noise generated by the second pad 23 of the integrated circuit element 2. In the presence of these conductive paths, the radiation noise does not arrive at the first internal terminal pad NT1 or NT2. The first internal terminal pads NT1 and NT2 and the second internal terminal pads NT3 and NT4 are spaced apart with the conductive paths interposed therebetween.

The radiation noise generated by the second pad 23 of the integrated circuit element 2 is accordingly blocked by the conductive paths from arriving at the first internal terminal pads NT1 and NT2. Because the conductive paths serve to block the radiation noise, the direct current potential or ground potential from the integrated circuit element 2 is applied to the third internal terminal pads NT5 and NT6.

The first internal terminal pads NT1 and NT2 and the second internal terminal pads NT3 and NT4 are formed in larger widths than the third internal terminal pads NT5 and NT6 located between the first and second internal terminal pads in a direction in parallel with the specific sides 101a and 102a of the first housing portion 10a.

The first internal terminal pads NT1 and NT2, second internal terminal pads NT3 and NT4, and third internal terminal pads NT5 and NT6 are respectively oppositely provided to be substantially symmetric to a virtual line L1 in parallel with the specific sides 101a and 102a passing through a center point O of the first housing portion 10a. The third internal terminal pads NT5 and NT6 are substantially oppositely provided along a virtual line L2 orthogonal to the specific sides 101a and 102a passing through the center point O of the first housing portion 10a.

According to this example, the third internal terminal pads NT5 and NT6 and the third wiring patterns H5 and H6 are formed substantially in an L-letter shape to be substantially symmetric to the virtual line L1 along sides NT11 and NT21 of the rectangular first internal terminal pads NT1 and NT2 nearest to the second internal terminal pads NT3 and NT4 and also along sides NT12 and NT22 thereof nearest to the bank portion 12 facing an external environment.

The third internal terminal pad NT5 and the third wiring pattern H5 formed substantially in an L-letter shape constitute a first radiation noise conductive path surrounding the first internal terminal pad NT1. The third internal terminal pad NT6 and the third wiring pattern H6 formed substantially in an L-letter shape constitute a second radiation noise conductive path surrounding the first internal terminal pad NT2.

Thus, the third internal terminal pads NT5 and NT6 and the third wiring patterns H5 and H6 are respectively formed substantially in an L-letter shape around the first internal terminal pads NT1 and NT2 to serve as the radiation noise conductive paths. As a result of the formation of these conductive paths, the first internal terminal pads NT1 and NT2 are shut off from the second internal terminal pads NT3 and NT4 by the conductive paths interposed therebetween without any area increase of the first housing portion 10a.

On the lower surface of the bottom portion 11 of the base 11 are formed a plurality of external terminal pads GT to be connected to external components or external devices. Specifically, they are external terminal pads GT1, GT2, GT3, and GT4 as illustrated in FIG. 3.

The external terminal pads GT1 to GT4 are electrically led out to any ones of the second internal terminal pads NT3 and NT4 and the third internal terminal pads NT5 and NT6 by conductive vias V1, V2, V3, and V4 vertically through-connecting the bottom portion 11 of the base 1, and/or wiring patterns for external connection (not illustrated in the drawing) formed in the castellations C1, C2, C3, and C4 by way of the second wiring patterns H3 and H4 and the third wiring patterns H5 and H6.

According to the invention, the second internal terminal pad NT3 and the second wiring pattern H3 are connected to the second pad 23 of the integrated circuit element 2 for AC output, and electrically led out to the external terminal pad GT1 formed on the bottom-surface side of the base through at least one of the conductive via V1 and the wiring pattern, not illustrated in the drawing, formed in an upper part of the castellation C1.

As a result of the connection, the external terminal pad GT1 serves as an AC output external terminal.

As described earlier, the holding table 10c on which the piezoelectric oscillation element 3 is mounted is formed on the upper surface of the bank portion 12 of the base 1, which is the inner bottom surface of the second housing portion 10b. On the upper surface of the holding table 10c are formed fourth internal terminal pads NT7 and NT8 to be connected to excitation electrodes 3 of the piezoelectric oscillation element 3.

More specifically, the fourth internal terminal pad NT7 connected to one of excitation electrodes 3 is electrically led out through a conductive via V5 through-connecting the first wiring pattern H1 and the bank portion 12. The second internal terminal pad NT8 connected to the other one of the excitation electrodes 3 is electrically led out by a conductive via V6 through-connecting the first wiring pattern H2 and the bank portion 12.

As mentioned earlier, the base 1 is formed by conventional ceramic laminating or metalizing. Similarly to the formation of the joint area 13a, the internal terminal pads, external terminal pads, and wiring patterns are formed by stacking layers, such as nickel plating layers and gold plating layers, on metalized layers of tungsten or molybdenum.

The integrated circuit element 2 housed in the first housing portion 10a is a one-chip integrated circuit element provided with an inverter amplifier (oscillation amplifier) such as C-MOS. The integrated circuit element 2 and the piezoelectric oscillation element 3 constitute an oscillator circuit.

As illustrated in FIG. 4, the integrated circuit element 2 has rectangular pads 21 to 26. Of these pads 21 to 26, two opposing first pads 21 and 22 are formed near a first side 2A of the integrated circuit element, two opposing second pads 23 and 24 are formed near a second side 2B of the integrated circuit element, and two opposing third pads 25 and 26 are formed between the first and second pads.

The first pads 21 and 22 are electrically connected to excitation electrodes of the piezoelectric oscillation element 3. Of the two second pads 23 and 24, the second pad 23 is a pad for AC output of the integrated circuit element 2. The plural pads 21 to 26 of the integrated circuit element 2 and the internal terminal pads NT1 to NT6 formed on the base 1 are electromechanically flip-chip bonded by means of, for example, gold bumps C by supersonic thermocompression bonding.

The piezoelectric oscillation element 3 is mounted in the upper direction of the integrated circuit element 2 in spaced relationship with the integrated circuit element 2. The piezoelectric oscillation element 3 is, for example, a rectangular AT-cut crystal oscillation plate. On front and back surfaces of the piezoelectric oscillation element 3 are oppositely formed a pair of rectangular excitation electrodes 31 and 32 and extracting electrodes thereof.

These electrodes are formed by layered thin films including a ground electrode layer formed of chrome or nickel, an intermediate electrode layer formed of silver or gold, and an upper electrode layer formed of chrome or nickel, or layered thin films including a ground electrode layer formed of chrome or nickel and an upper electrode layer formed of silver or gold. These electrodes are formed by thin film formation technique such as vacuum evaporation or sputtering.

The piezoelectric oscillation element 3 and the base 1 are bonded to each other with a conductive bonding material such as a pasty silicone-based conductive resin adhesive S containing metallic fine particles of, for example, a silver filler.

As illustrated in FIG. 1, the conductive resin adhesive S is applied to the upper surfaces of the first internal terminal pad NT7 and the second internal terminal pad NT8. The conductive resin adhesive S is also applied to between one end part of the piezoelectric oscillation element 3 and the holding table 10c and then cured, so that the one end part of the piezoelectric oscillation element 3 and the holding table 10c are electromechanically bonded to each other. The piezoelectric oscillation element 3 is accordingly held one-sidedly in spaced relationship with the inner bottom surface 10a1 of the housing portion 10a of the base 1.

The cover 4 which hermetically seals the base 1 is, for example, a core member made of Kovar and brazed with a metallic brazing material. The brazing material serving as a sealing material 5 bonds the cover 4 to the joint area (metallic film) 13a of the base 1. In planar view, the cover 4 has an outer shape substantially equal to or slightly smaller than the shape of the ceramic base.

After the integrated circuit element 2 and the piezoelectric oscillation element 3 is housed in the housing portion 10 of the base 1, the joint area 13a of the base 1 is closed with the cover 4, and the sealing material 5 of the cover 4 and the joint area 13a of the base are melted and then cured, so that the integrated circuit element 2 and the piezoelectric oscillation element 3 are hermetically sealed. As a result of these processes, production of the crystal oscillator 6 is completed.

An example 2 of the invention is hereinafter described referring to FIGS. 5 and 6. A crystal oscillator 8 has a base 7 having a recessed portion with openings on its upper- and lower-surface sides. The base 7 is an H-mounting base where an integrated circuit element 2 is mounted on an inner bottom surface of the lower recessed portion and a piezoelectric oscillation element 3 is mounted on an inner bottom surface of the upper recessed portion. Description of any components of FIGS. 5 and 6 similar to those described in the first example may be partly omitted.

The base 7 includes a ceramic laminated substrate, and its overall shape is rectangular parallelepiped. As illustrated in FIG. 5, the base 7 includes an intermediate plate portion 71 which is a middle layer, a bank portion 72 which is an uppermost layer, and a bank portion 73 which is a lowermost layer.

The intermediate plate portion 71 is constructed of a single plate rectangular in planar view and formed of an insulating ceramic material such as alumina.

The bank portion 72 is formed of a ceramic material on the upper surface of the intermediate plate portion 71. The bank portion 72 has a frame shape in planar view.

The bank portion 73 is formed of a ceramic material on the lower surface of the intermediate plate portion 71. The bank portion 73 has a frame shape in planar view As described so far, the base 7 is a box-shaped member whose overall shape is the letter of H when viewed in cross section. The base 7 has two housing portions on its upper and lower sides; first and second housing portions 70a and 70b. The bank portion 72 is formed along perimeter of the housing portion 70a. The bank portion 72 has a flattened upper surface. The bank portion 73 is formed along perimeter of the housing portion 70b. The bank portion 73 has a flattened lower surface. The piezoelectric oscillation element 3 is housed in the first housing portion 70a. The integrated circuit element 2 is housed in the second housing portion 70b. The base 7 has a three-layer structure where the intermediate plate portion 71 and the bank portions 72 and 73 are stacked on one another. The base 7, however, may include four or more layers depending on the shapes of the housing portions formed in the base.

The upper surface of the bank portion 72 of the base 1 is a joint area 72a to be joined to the cover 4. A metallic film constitutes the joint area 72a. More specifically, the metallic layer includes three metallic layers; a metalized layer formed of a metalizing material such as tungsten or molybdenum, a nickel layer formed on the metalized layer, and a gold layer formed on the nickel layer. These layers are integrally formed during firing of the ceramic material by metalizing in which thick film printing is leveraged. Then, the nickel layer and the gold layer are formed on the metalized layer by plating in the mentioned order.

At four corners of the outer peripheral wall of the base 7 are formed a plurality of castellations C1, C2, C3, and C4 vertically extending. These castellations C1 to C4 are obtained by vertically forming circular cutouts in the outer peripheral wall of the base.

The joint area 72a is electrically led out to a part of an external terminal pad GT2 formed on the bottom-surface side of the base through at least one of a conductive via, not illustrated in the drawings, vertically through-connecting the bank portion 72 and the intermediate plate portion 71 of the base, and a wiring pattern, not illustrated in the drawings, formed in an upper part of the castellation C2.

When the external terminal pad GT2 is ground-connected, the metallic cover 4 is grounded through the joint area 72a, conductive via, and wiring pattern in the upper part of the castellation. As a result of the grounding, the crystal oscillator 8 exerts an electromagnetic shielding effect.

On the lower inner surface of the base 7 is provided the second housing portion 70b formed by the bank portion 73, in which the integrated circuit element 2 is housed. The second housing portion 70b has a substantially rectangular shape in planar view. On the upper inner surface of the base 7 is provided the first housing portion 70a formed by the bank portion 72, in which the piezoelectric oscillation element 3 is housed. The first housing portion 70a has a substantially rectangular shape in planar view. The second housing portion 70b has a substantially rectangular shape with two specific sides 71b and 72b in parallel with a direction where first internal terminal pads NT1 and NT2, second internal terminal pads NT3 and NT4, and third internal terminal pads NT5 and NT6 are juxtaposed.

On the lower surface of the intermediate plate portion 71 of the base 7 that is the inner bottom surface of the second housing portion 70b, there are a plurality of rectangular internal terminal pads NT connected to the integrated circuit element 2, and wiring patterns H which extend these pads. These pads and wiring patterns are formed adjacent to one another.

More specifically, as illustrated in FIG. 6, the internal terminal pads NT formed on the lower surface of the intermediate plate portion 71 of the base 7 are two opposing first internal terminal pads NT1 and NT2 electrically connected to the piezoelectric oscillation element 3 and further connected to first pads 21 and 22 of the integrated circuit element 2, two opposing second internal terminal pads NT3 and NT4 connected to second pads 23 and 24 of the integrated circuit element 2, and two opposing third internal terminal pads NT5 and NT6 connected to third pads 25 and 26 of the integrated circuit element 2.

The wiring patterns H formed on the lower surface of the intermediate plate portion 71 of the base 7 are first wiring patterns H1 and H2 which respectively extend the first internal terminal pads NT1 and NT2, second wiring patterns H3 and H4 which respectively extend the second internal terminal pads NT3 and NT4, and third wiring patterns H5 and H6 which respectively extend the third internal terminal pads NT5 and NT6.

As illustrated in FIG. 6, the third internal terminal pad NT5 and the third wiring pattern H5 which extends this pad are formed along two sides (along a part of two sides) of the first internal terminal pad NT1. Further, the third internal terminal pad NT6 and the third wiring pattern H6 which extends this pad are formed along two sides (along a part of two sides) of the first internal terminal pad NT2. The third internal terminal pad NT5 and the third wiring pattern H5, and the third internal terminal pad NT6 and the third wiring pattern H6 respectively form radiation noise blocking conductive paths. These conductive paths serve to block radiation noise generated by the second pad 23 of the integrated circuit element 2, so that the radiation noise does not arrive at the first internal terminal pads NT1 and NT2.

The first internal terminal pads NT1 and NT2 and the second internal terminal pads NT3 and NT4 are spaced apart with the conductive paths interposed therebetween. The radiation noise generated by the second pad 23 of the integrated circuit element 2 is accordingly prevented from arriving at the first internal terminal pads NT1 and NT2.

Because the conductive paths serve to block the radiation noise, the direct current potential or ground potential from the integrated circuit element 2 is applied to the third internal terminal pads NT5 and NT6.

The first internal terminal pads NT1 and NT2 and the second internal terminal pads NT3 and NT4 are formed in larger widths than the third internal terminal pads NT5 and NT6 located between the first and second internal terminal pads in a direction in parallel with the specific sides 71b and 72b of the second housing portion 70b. The two first internal terminal pads NT1 and NT2, two second internal terminal pads NT3 and NT4, and two third internal terminal pads NT5 and NT6 are respectively oppositely provided to be substantially symmetric to a virtual line L1 in parallel with the specific sides 71b and 72b passing through a center point O of the second housing portion 70b. The two third internal terminal pads NT5 and NT6 are substantially oppositely provided along a virtual line L2 orthogonal to the specific sides 71b and 72b passing through the center point O of the second housing portion 70b.

The third internal terminal pads NT5 and NT6 and the third wiring patterns H5 and H6 which extend these pads are formed substantially in an L-letter shape to be substantially symmetric to the virtual line L1 along two sides NT11 and NT21 of the rectangular first internal terminal pads NT1 and NT2 nearest to the second internal terminal pads NT3 and NT4 and also along two sides NT12 and NT22 thereof nearest to the bank portion 73 facing an external environment.

The third internal terminal pad NT5 and the third wiring pattern H5 formed substantially in an L-letter shape constitute a first radiation noise conductive path surrounding the first internal terminal pad NT1. The third internal terminal pad NT6 and the third wiring pattern H6 formed substantially in an L-letter shape constitute a second radiation noise conductive path surrounding the first internal terminal pad NT2. As a result of the formation of these conductive paths, the first internal terminal pads NT1 and NT2 are shut off from the second internal terminal pads NT3 and NT4 by the conductive paths interposed therebetween without any area increase of the second housing portion 10b.

On the flattened lower surface of the bank portion 73 of the base 7 are formed a plurality of external terminal pads GT to be connected to external components and external devices. More specifically, as illustrated in FIG. 6, external terminal pads GT1 to GT4 are electrically led out to any ones of the second internal terminal pads NT3 and NT4 and the third internal terminal pads NT5 and NT6 by conductive vias through-connecting upper parts and/or wiring patterns for external connection (not illustrated in the drawing) formed in the castellations C1, C2, C3, and C4 by way of the second wiring patterns H3 and H4 and the third wiring patterns H5 and H6.

The second internal terminal pad NT3 and the second wiring pattern H3 are connected to the second pad 23 for AC output of the integrated circuit element 2, and further connected to the external terminal pad GT1. The external terminal pad GT1 accordingly serves as an AC output external terminal.

On the upper surface of the intermediate plate portion 71 of the base 7, which is an inner bottom surface 70a1 of the first housing portion 70a, are formed fourth internal terminal pads NT7 and NT8 (partly illustrated in the drawing) to be connected to excitation electrodes of the piezoelectric oscillation element 3. The first wiring patterns H1 and H2 are electrically led out by conductive vias, not illustrated in the drawings, through-connecting the intermediate plate portion 71.

The base 7 thus structurally characterized is formed by conventional ceramic laminating or metalizing. Similarly to the formation of the joint area 72a, the internal terminal pads, external terminal pads, and wiring patterns are formed by stacking layers such as nickel plating layers and gold plating layers on metalized layers of tungsten or molybdenum.

As illustrated in FIG. 5, the plural pads 21 to 26 of the integrated circuit element 2 and the internal terminal pads NT1 to NT6 formed on the base 7 are electromechanically flip-chip bonded by means of, for example, gold bumps C by supersonic thermocompression bonding.

The piezoelectric oscillation element 3 is bonded to the base 7 with a conductive bonding material such as a pasty silicone-based conductive resin adhesive S containing metallic fine particles of, for example, a silver filler. As illustrated in FIG. 5, the conductive resin adhesive S is applied to the upper surfaces of the first internal terminal pad NT7 and the second internal terminal pad NT8. The conductive resin adhesive S is also applied to between the piezoelectric oscillation element 3 and the inner bottom surface 70a1 of the first housing portion 70a of the base 7 and then cured, so that the first and second internal terminal pads NT7 and NT8 are electromechanically bonded to the inner bottom surface 70a1 of the first housing portion 70a.

By bonding one end part of the piezoelectric oscillation element 3 to the inner bottom surface 70a1 of the first housing portion 70a of the base 7 with the other end part of the piezoelectric oscillation element 3 being spaced from the inner bottom surface 70a1 of the first housing portion 70a of the base 7, the piezoelectric oscillation element is held one-sidedly.

The cover 4 which hermetically seals the base 7 is, for example, a core member formed of Kovar and brazed with a metallic brazing material. The brazing material serving as a sealing material 5 bonds the cover 4 to the joint area (metallic film) 72a of the base 1. In planar view, the metallic cover has an outer shape substantially equal to or slightly smaller than the shape of the ceramic base.

After the integrated circuit element 2 is housed in the second housing portion 70b of the base 7 and the piezoelectric oscillation element 3 is housed in the first housing portion 70a, the joint area 72a of the base 7 is closed with the cover 4, and the sealing material 5 of the metallic cover 4 and the joint area 72a of the base are melted and then cured. Then, the piezoelectric oscillation element 3 is hermetically sealed. As a result of these processes, production of the crystal oscillator 8 is completed.

In the first and second examples, the third internal terminal pads NT5 and NT6 and the third wiring patterns H5 and H6 are formed, respectively as first and second conductive paths for blocking radiation noise, along two sides (along a part of two sides) of the first internal terminal pads NT1 and NT2. As a result, the first internal terminal pads NT1 and NT2 electrically connected to the piezoelectric oscillation element 3 and the second internal terminal pad NT3 for AC output of the integrated circuit element 2 can be spaced apart with the conductive paths interposed therebetween.

As mentioned earlier, the direct current potential or ground potential is applied to the conductive paths. Therefore, radiation noise, if generated by the alternating current signals or high frequency signals flowing through the second internal terminal pad NT3, is blocked by the conductive paths and thereby arrive at neither of the first internal terminal pad NT1 nor NT2 connected to the piezoelectric oscillation element 3 more easily affected by the noise. Consequently, any impacts of the radiation noise generated by the AC output of the second internal terminal pad NT3 are controlled not to affect the piezoelectric oscillation element 3 electrically connected to the first internal terminal pads NT1 and NT2.

When the internal terminal pads NT1 to NT6 of the bases 1 and 7 and the pads 21 to 26 of the integrated circuit element 2 are flip-chip bonded by means of the bumps C, any positional displacement of the bumps C relative to the pads or any positional displacement between the pads of the integrated circuit element and the internal terminal pads of the bases is absorbed by the first and second internal terminal pads NT1, NT2, NT3, and NT4.

This prevents such an unfavorable event that the bumps stick out of the internal terminal pads NT1 to NT6 at the time of bonding. Because the first internal terminal pads NT1 and NT2 and the second internal terminal pads TN3 and TN4 are formed in larger widths than the third internal terminal pads NT5 and NT6, integrated circuit elements 2 of various types with slightly different plane areas and/or with pads somewhat differently located can be similarly mounted on the bases 1 and 7. This provides a diversified range of products and facilitates cost reduction.

The piezoelectric oscillators 6 and 8 thus structurally characterized can be miniaturized by reducing distances between the first internal terminal pads NT1 and NT2 and the second and second internal terminal pads NT3 and NT4 without undermining the radiation noise blocking effect by the third internal terminal pads formed in small widths in the direction where the internal terminal pads are juxtaposed. The invention, while succeeding in miniaturizing the piezoelectric oscillators 6 and 8, can improve mountability in flip-chip bonding of the integrated circuit element 2, bonding reliability, and versatility.

According to the examples described so far, the first internal terminal pads NT1 and NT2, second internal terminal pads NT3 and NT4, and third internal terminal pads NT5 and NT6 are respectively oppositely provided to be substantially symmetric to the virtual line L1 in parallel with the specific sides passing through the center point O of the housing portion where the integrated circuit element is housed.

This structural advantage helps to equalize the variability of height dimensions of the respective pads when warped in the direction orthogonal to the specific sides of the housing portion where the integrated circuit element is housed, more specifically, height dimensions of the paired first pads 21 and 22 and first internal terminal pads NT1 and NT2, paired second pads 23 and 24 and second internal terminal pads NT3 and NT4, and paired third pads 25 and 26 and third internal terminal pads NT5 and NT6.

To flip-chip bond the internal terminal pads of the bases 1 and 7 and the pads of the integrated circuit element by means of bumps by supersonic thermocompression bonding, an equal pressing force is dispersedly applied to pairs of bumps C respectively used in the paired first pads 21 and 22 and first internal terminal pads NT1 and NT2 that, paired second pads 23 and 24 and second internal terminal pads NT3 and NT4, and paired third pads 25 and 26 and third internal terminal pads NT5 and NT. This avoids the risk of strength variability.

The third internal terminal pads NT5 and NT6 are substantially oppositely provided along the virtual line L2 orthogonal to the specific sides passing through the center point O of the housing portion where the integrated circuit element is housed.

To flip-chip bond the internal terminal pads NT1 to NT6 and the pads 21 to 26 of the integrated circuit element 2 by means of the bumps C by supersonic thermocompression bonding, the center point of the integrated circuit element 2 can be located near an apex of warps in two directions (near the center point O according to the examples); a direction along the specific sides of the housing portion where the integrated circuit element is housed, and a direction orthogonal thereto.

As a result, an equal pressing force and an equal compression strength are applied to the bumps C at six positions in total of the paired first pads 21 and 22 and first internal terminal pads NT1 and NT2, paired second pads 23 and 24 and second internal terminal pads NT3 and NT4, and paired third pads 25 and 26 and third internal terminal pads NT5 and NT6. This provides an increased bonding strength and a higher reliability. Thus, the invention, while succeeding in miniaturizing the piezoelectric oscillators 6 and 8, can stabilize the bonding strength of the bumps C in the flip-chip bonding of the integrated circuit element 2, thereby ensuring more reliable electromechanical bonding.

The AT-cut crystal oscillation plate is used as the piezoelectric oscillation element in the examples described so far. However, the piezoelectric oscillation element is not necessarily limited thereto but may be a crystal oscillation plate of tuning fork type.

The material of the piezoelectric oscillation element is crystal, however, is not necessarily limited thereto. The material may be piezoelectric ceramics or monocrystal materials such as LiNbO3.

Any piezoelectric oscillation element is arbitrarily usable. In place of holding the piezoelectric oscillation element one-sidedly as described in the examples, both ends of the piezoelectric oscillation element may be held. In place of the silicone-based conductive resin adhesive used as the conductive bonding material in the examples, anyone of metallic materials and brazing materials used in metallic bumps and metal-plated bumps may be used.

The invention is applied to the piezoelectric oscillation element 3 and the integrated circuit element 2, however, is also applicable to other devices. It is arbitrarily decided how many piezoelectric oscillation elements are used.

The invention is applicable to piezoelectric oscillators mounted with, in addition to the integrated circuit element 2, other circuit components. According to one of the examples of the invention, the crystal oscillator is an H-mounting oscillator. However, the invention is applicable to a horizontal-mounting crystal oscillator wherein a base has an opening on its upper-surface side alone, and an integrated circuit element and a piezoelectric oscillation element are juxtaposed on an inner bottom surface of a recessed portion.

The invention is also applicable to crystal oscillators of tiered box type wherein a substrate with a recessed portion for integrated circuit element and another substrate with a recessed portion for piezoelectric oscillation element are prepared and stacked on each other in a thickness direction. Structural components to be mounted on bases are arbitrarily changed depending on fields of application.

The electrical connection between the integrated circuit and the base is not necessarily provided by flip-chip bonding in which supersonic thermocompression is leveraged, and other bonding techniques may be employed. The oscillator circuit according to the invention is not necessarily configured as described in the examples but may be further provided with, for example, an oscillation amplifier.

According to the examples of the invention, inside of the base is sealed with a metallic brazing material but may be sealed differently, for example, by seam welding using laser beam, electronic beam, or a glass material.

The invention is applicable to piezoelectric oscillators of surface mount type. The invention can be carried out in many other modes without departing from its technical concept or principal technical features. The examples described so far are just a few examples of the invention in all aspects, which should not be used to restrict the scope of the invention. The scope of the invention is solely defined by the appended claims, and should not be restricted by the text of this description. Any modifications or changes made within the scope of equivalents of the appended claims are all included in the scope of the invention.

INDUSTRIAL APPLICABILITY

The invention is applicable to piezoelectric oscillators of surface mount type.

DESCRIPTION OF REFERENCE SYMBOLS

1, 7 base
2 integrated circuit element
3 piezoelectric oscillation element
4 cover
5 sealing material
6, 8 crystal oscillator
10 housing portion
10*a* first housing portion
10*b* second housing portion
10*c* holding table
10*d* pillow portion
11 bottom portion
12 bank portion
13 bank portion
NT1, NT2 first internal terminal pad
NT3, NT4 second internal terminal pad
NT5, NT6 third internal terminal pad
H1, H2 first wiring pattern
H3, H4 second wiring pattern
H5, H6 third wiring pattern
S conductive resin adhesive (conductive boding material)
C metallic bump
V conductive via

The invention claimed is:

1. A surface mount type piezoelectric oscillator, comprising:
   an insulating base including a laminated substrate and provided with a housing portion and a plurality of internal terminal pads formed on an inner bottom surface of the housing portion;
   an integrated circuit element having a rectangular shape and pads formed on a main surface thereof and bonded to a part of the internal terminal pads of the base by means of bumps; and
   a piezoelectric oscillation element electromechanically bonded to another part of the internal terminal pads of the base and electrically connected to the integrated circuit element, wherein
   the pads of the integrated circuit element include two opposing first pads formed near a first side of the integrated circuit element, two opposing second pads formed near a second side opposite to the first side of the integrated circuit element, and two opposing third pads formed between the first pads and the second pads, and one of the two second pads is used to output alternating current signals of the integrated circuit element,
   the internal terminal pads of the base include two opposing first internal terminal pads electrically connected to the piezoelectric oscillation element and bonded to the two first pads of the integrated circuit element, two opposing second internal terminal pads bonded to the two second pads of the integrated circuit element, and two opposing third internal terminal pads bonded to the two third pads of the integrated circuit element, and
   the third internal terminal pads and wiring patterns which extend the third internal terminal pads are formed along a part of perimeter of the first internal terminal pads as conductive paths for blocking radiation noise,
   the two first internal terminal pads and the two second internal terminal pads are respectively formed at positions spaced apart with the conductive paths interposed therebetween, and the wiring patterns which extend the third internal terminal pads are formed on the inner bottom surface of the housing portion along with the first to third internal terminal pads, the conductive paths include a first conductive path and a second conductive path, the first conductive path having substantially equal width over a whole thereof along a part of a perimeter of one of the two opposing first internal terminal pads, the second conductive path having substantially equal width over a whole thereof along a part of the perimeter of an other of the two opposing first internal terminal pads, a direct current potential or ground potential is applied to both the first conductive path and the second conductive path, and an opposing interval between the first terminal pads is shorter than each width in an opposing direction of the first internal terminal pads, and an opposing interval between the third internal terminal pads is substantially the same extent as the opposing interval between the first internal terminal pads.

2. The surface mount type piezoelectric oscillator as claimed in claim 1, wherein
the first internal terminal pads and the second internal terminal pads are formed in larger widths than the third internal terminal pads located between the first and second internal terminal pads in a direction where the two first internal terminal pads, the two second internal terminal pads, and the two third internal terminal pads are juxtaposed.

3. The surface mount type piezoelectric oscillator as claimed in claim 1, wherein the base includes a ceramic substrate.

4. The surface mount type piezoelectric oscillator as claimed in claim 1, wherein the pads are bonded by flip-chip bonding.

5. The surface mount type piezoelectric oscillator as claimed in claim 1, wherein
the first conductive path is formed substantially in an L-letter shape along the part of perimeter of one of the two opposing first internal terminal pads; and
the second conductive path is formed substantially in an L-letter shape along the part of perimeter of the other one of the two opposing first internal terminal pads.

6. The surface mount type piezoelectric oscillator as claimed in claim 5, wherein
one of the two opposing first internal terminal pads is for inputting alternate current signals, and the other one of the two opposing first internal terminal pads is for outputting alternate current signals, and
one of the two opposing second internal terminal pads bonded to the two second pads is for outputting alternate current signals, and the other one of the two opposing second internal terminal pads is for grounding.

7. The surface mount type piezoelectric oscillator as claimed in claim 1, wherein the piezoelectric oscillation element is an AT-cut crystal oscillation plate.

8. The surface mount type piezoelectric oscillator as claimed in claim 1, wherein
the base includes a bottom portion which is a lowermost layer, a first bank portion which is a middle layer, and a second bank portion which is an uppermost layer,
the bottom portion is formed from a single plate having a rectangular shape in planar view and made of a ceramic material,
the first bank portion is formed of a ceramic material on the bottom portion in a frame shape in planar view,
the second bank portion is formed of a ceramic material on the first bank portion in a frame shape in planar view,
the housing portion of the base includes a first housing portion formed by the first bank portion where the integrated circuit element is housed, and a second housing portion formed by the second bank portion where the piezoelectric oscillation element is housed, and
the first to third internal terminal pads are formed on an inner bottom surface of the first housing portion.

\* \* \* \* \*